(12) United States Patent
Ideno et al.

(10) Patent No.: US 10,834,823 B2
(45) Date of Patent: Nov. 10, 2020

(54) PRODUCING METAL/CERAMIC CIRCUIT BOARD BY REMOVING RESIDUAL SILVER

(71) Applicant: Dowa Metaltech Co., Ltd., Tokyo (JP)

(72) Inventors: Takashi Ideno, Tokyo (JP); Ayumu Ozaki, Tokyo (JP); Koji Kobayashi, Tokyo (JP)

(73) Assignee: Dowa Metaltech Co., Ltd., Tokyo (JP)

( * ) Notice: Subject to any disclaimer, the term of this patent is extended or adjusted under 35 U.S.C. 154(b) by 343 days.

(21) Appl. No.: 15/891,617

(22) Filed: Feb. 8, 2018

(65) Prior Publication Data

US 2018/0255645 A1 Sep. 6, 2018

(30) Foreign Application Priority Data

Mar. 3, 2017 (JP) .................................. 2017-040825

(51) Int. Cl.
*H05K 3/02* (2006.01)
*H05K 1/03* (2006.01)
(Continued)

(52) U.S. Cl.
CPC ........... *H05K 3/022* (2013.01); *B23K 1/0016* (2013.01); *B23K 1/19* (2013.01); *C04B 37/026* (2013.01); *H01L 21/4871* (2013.01); *H01L 23/3735* (2013.01); *H05K 1/0306* (2013.01); *H05K 3/06* (2013.01); *H05K 3/38* (2013.01); *B23K 2101/42* (2018.08); *B23K 2103/12* (2018.08); *B23K 2103/18* (2018.08); *B23K 2103/52* (2018.08);
(Continued)

(58) Field of Classification Search
CPC .. H05K 2201/0769; H05K 3/06; H05K 3/067; H05K 3/26
See application file for complete search history.

(56) References Cited

U.S. PATENT DOCUMENTS 5,354,415 A * 10/1994 Fushii ...................... H05K 3/06
216/108
6,613,450 B2 * 9/2003 Tsukaguchi ............. B32B 18/00
428/621

(Continued)

FOREIGN PATENT DOCUMENTS

EP 1298970 A2 4/2003
EP 1465251 A2 10/2004
(Continued)

OTHER PUBLICATIONS

European search report for patent application No. 18155214.2-1202 dated Jul. 12, 2018.

*Primary Examiner* — Erin B Saad
*Assistant Examiner* — Carlos J Gamino
(74) *Attorney, Agent, or Firm* — Bachman and Lapointe PC; George Coury

(57) ABSTRACT

After a copper plate 14 is bonded to at least one surface of a ceramic substrate 10 via an active metal containing brazing filler metal 12 which contains silver, the unnecessary portion of the copper plat 14 and active metal containing brazing filler metal 12 is removed, and thereafter, an unnecessary portion of the copper plate 14 is removed by chemical polishing so as to cause the active metal containing brazing filler metal 12 to protrude from the side face portion of the copper plate 14, and then, a silver layer 18 adhered to the surface of the copper plate 14 by the chemical polishing is removed.

8 Claims, 4 Drawing Sheets

(51) Int. Cl.
*B23K 1/00* (2006.01)
*H01L 21/48* (2006.01)
*C04B 37/02* (2006.01)
*H01L 23/373* (2006.01)
*H05K 3/06* (2006.01)
*H05K 3/38* (2006.01)
*B23K 1/19* (2006.01)
*B23K 101/42* (2006.01)
*H05K 3/26* (2006.01)
*B23K 103/12* (2006.01)
*B23K 103/00* (2006.01)
*B23K 103/18* (2006.01)

(52) U.S. Cl.
CPC ...... *B23K 2201/42* (2013.01); *C04B 2237/12* (2013.01); *C04B 2237/124* (2013.01); *C04B 2237/125* (2013.01); *C04B 2237/127* (2013.01); *C04B 2237/341* (2013.01); *C04B 2237/343* (2013.01); *C04B 2237/365* (2013.01); *C04B 2237/366* (2013.01); *C04B 2237/368* (2013.01); *C04B 2237/407* (2013.01); *C04B 2237/70* (2013.01); *H05K 3/067* (2013.01); *H05K 3/26* (2013.01); *H05K 2201/0769* (2013.01); *H05K 2201/09845* (2013.01)

(56) References Cited

U.S. PATENT DOCUMENTS

| | | | | |
|---|---|---|---|---|
| 7,048,866 | B2* | 5/2006 | Nakamura | H01L 23/3735 216/13 |
| 9,017,563 | B2* | 4/2015 | Ushioda | C23C 22/52 205/162 |
| 2003/0066865 | A1* | 4/2003 | Tsukaguchi | H05K 3/06 228/122.1 |
| 2004/0069528 | A1* | 4/2004 | Sakuraba | H01L 23/3735 174/257 |
| 2004/0262367 | A1* | 12/2004 | Nakamura | H01L 23/3735 228/122.1 |
| 2016/0192503 | A1* | 6/2016 | Chiwata | H01L 23/12 29/847 |

FOREIGN PATENT DOCUMENTS

| | | | |
|---|---|---|---|
| JP | 10125821 | A | 5/1998 |
| JP | 10251878 | A * | 9/1998 |
| JP | 2001332854 | A | 11/2001 |
| JP | 2004307307 | A | 11/2004 |
| JP | 2006228918 | A | 8/2006 |

* cited by examiner

PRODUCING METAL/CERAMIC CIRCUIT BOARD BY REMOVING RESIDUAL SILVER

BACKGROUND OF THE INVENTION

Field of the Invention

The present invention relates generally to a method for producing a metal/ceramic circuit board. More specifically, the invention relates to a method for producing a metal/ceramic circuit board wherein a metal plate is bonded to a ceramic substrate by means of an active metal containing brazing filler metal.

Description of the Prior Art

Conventionally, power modules are used for controlling heavy-current for electric vehicles, electric railcars and machine tools. As an insulating substrate for such power modules, there is used a metal/ceramic circuit board wherein portions of a metal circuit plate, on which chip parts and terminals are required to be soldered, and so forth are plated, the metal circuit plate being bonded to one surface of a ceramic substrate.

In such a metal/ceramic circuit board, cracks are easily formed in a ceramic substrate by a thermal stress based on the difference in thermal expansion which is caused between the ceramic substrate and the metal circuit plate by thermal shocks after bonding.

As a method for relaxing such a thermal stress, there is known a method for thinning the peripheral portion (creeping portion) of a metal circuit plate, e.g., a method for forming a stepped structure or a fillet (the protruding portion of a brazing filler metal used for bonding a metal circuit plate to a ceramic substrate) on the peripheral portion of the metal circuit plate (see, e.g., Japanese Patent Laid-Open Nos. 10-125821, 2001-332854 and 2004-307307).

However, if a metal/ceramic circuit board, in which an active metal containing brazing filler metal for bonding a metal circuit plate (such as a copper circuit plate) to a ceramic substrate has a protruding portion (fillet), is mounted in a powder module, there is some possibility that the migration of metals in an active metal containing brazing filler metal (silver or copper when a brazing filler metal containing an active metal, silver and copper is used) may be caused in portions between the circuit patterns of the metal circuit plate on the ceramic substrate and so forth to cause insulation failure.

As a method for preventing such a migration, there is known a method for carrying out electroless Ni—P plating on the surface of the protruding portion of the brazing filler metal protruding from the edge portion of a metal plate (see, e.g., Japanese Patent Laid-Open No. 2006-228918).

However, even if Ni—P plating is carried out on the protruding portion of an active metal containing brazing filler metal, it is not possible to sufficiently suppress the occurrence of migration due to a heat treatment (such as soldering) and/or coating based on an insulating gel in an assembling process when a metal/ceramic circuit board is mounted in a power module.

SUMMARY OF THE INVENTION

It is therefore an object of the present invention to eliminate the aforementioned problems and to provide a method for producing a metal/ceramic circuit board which can sufficiently suppress the occurrence of migration in a method for producing a metal/ceramic circuit board wherein a metal plate is bonded to a ceramic substrate by means of an active metal containing brazing filler metal.

In order to accomplish the aforementioned and other objects, the inventors have diligently studied and found that it is possible to produce a metal/ceramic circuit board which can sufficiently suppress the occurrence of migration in a method for producing a metal/ceramic circuit board wherein a metal plate is bonded to a ceramic substrate by means of an active metal containing brazing filler metal, if the metal/ceramic circuit board is produced by a method comprising the steps of: bonding a copper plate to at least one surface of a ceramic substrate via an active metal containing brazing filler metal which contains silver; removing an unnecessary portion of the copper plate and active metal containing brazing filler metal; thereafter, removing an unnecessary portion of the copper plate by chemical polishing so as to cause the active metal containing brazing filler metal to protrude from a side face portion of the copper plate; and removing silver adhered to the surface of the copper plate by the chemical polishing.

According to the present invention, there is provided a method for producing a metal/ceramic circuit board, the method comprising the steps of: bonding a copper plate to at least one surface of a ceramic substrate via an active metal containing brazing filler metal which contains silver; removing an unnecessary portion of the copper plate and active metal containing brazing filler metal; thereafter, removing an unnecessary portion of the copper plate by chemical polishing so as to cause the active metal containing brazing filler metal to protrude from a side face portion of the copper plate; and removing silver adhered to the surface of the copper plate by the chemical polishing.

In this method for producing a metal/ceramic circuit board, the active metal containing brazing filler metal preferably comprises silver, copper and an active metal. The active metal containing brazing filler metal may contain tin. Preferably, the content of silver in the active metal containing brazing filler metal is not less than 70% by weight. After removing silver adhered to the surface of the copper plate, a plating film is preferably formed on an exposed surface of the copper plate and active metal containing brazing filler metal. The plating film is preferably formed by electroless nickel alloy plating. The chemical polishing is preferably carried out by a chemical polishing solution having a copper dissolving rate which is ten times or more as high as a silver dissolving rate. The removal of silver is preferably carried out by a silver removing solution having a silver dissolving rate which is ten times or more as high as a copper dissolving rate.

According to the present invention, it is possible to produce a metal/ceramic circuit board which can sufficiently suppress the occurrence of migration in a method for producing a metal/ceramic circuit board wherein a metal plate is bonded to a ceramic substrate by means of an active metal containing brazing filler metal.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Figure 1A:
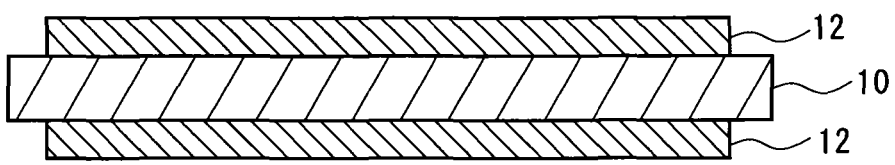
FIG. 1A is a sectional view showing a state that an active metal containing brazing filler metal is printed on a ceramic substrate in the preferred embodiment of a method for producing a metal/ceramic circuit board.

In the preferred embodiment of a method for producing a metal/ceramic circuit board, after a copper plate is bonded to at least one surface of a ceramic substrate via an active metal containing brazing filler metal which contains silver, the unnecessary portion of the copper plate and active metal containing brazing filler metal is removed, and thereafter, the unnecessary portion of the copper plate is removed by chemical polishing so as to cause the active metal containing brazing filler metal to protrude from the side face portion of the copper plate to form a fillet, and then, silver adhered to the surface of the copper plate by the chemical polishing is removed (with a silver removing solution).

In the above-described method for producing a metal/ceramic circuit board, the ceramic substrate may be a substrate of an oxide mainly containing alumina, silica or the like, or a substrate of a non-oxide mainly containing aluminum nitride, silicon nitride, silicon carbonate or the like, and the substrate may have a size of about 5 to 200 mm×5 to 200 mm and a thickness of 0.25 to 3.0 mm (preferably 0.3 to 1.0 mm).

The active metal containing brazing filler metal preferably may contain silver, copper and an active metal as metal elements. The active metal containing brazing filler metal may contain tin, the content of which is 10% or less with respect to the total of the metal elements. The content of silver with respect to the total metal elements in the active metal containing brazing filler metal is preferably not less than 70% by weight, more preferably 70 to 95% by weight, and most preferably 75 to 93% by weight. The content of the active metal with respect to the total of the metal elements in the active metal containing brazing filler metal is preferably 1 to 5% by weight, and more preferably 1 to 3% by weight. As the active metal component in the active metal containing brazing filler metal, there may be used at least one selected from the group consisting of titanium, zirconium, hafnium and a hydride thereof. In order to produce a metal/ceramic circuit board which can sufficiently suppress the occurrence of migration, the active metal containing brazing filler metal preferably contains tin.

The removal of the unnecessary portion of the copper plate can be carried out by, e.g., dipping the copper plate in an etching solution containing copper chloride or iron chloride, or spraying the etching solution onto the copper plate. The removal of the unnecessary portion of the active metal containing brazing filler metal can be carried out by, e.g., dipping the brazing filler metal in a chelate containing chemical solution or a hydrofluoric acid chemical solution, or spraying the chemical solution onto the brazing filler metal.

The chemical polishing is preferably carried out by dipping the copper plate in a chemical polishing solution or spraying the chemical polishing solution onto the copper plate. The chemical polishing solution has a copper dissolving rate which is preferably ten times or more (more preferably fifty times or more) as high as a silver dissolving rate. As such a chemical polishing solution, there can be used a chemical polishing solution comprising sulfuric acid, hydrogen peroxide and the balance being water, or a commercially available chemical polishing solution for copper. The chemical polishing can improve the appearance, wire bonding ability, solder wettability and so forth of the metal/ceramic circuit board, and can improve the thermal shock resistance of the metal/ceramic circuit board by forming a fillet having a width (a length of the active metal containing brazing filler metal which extends along the ceramic substrate to protrude from the side face of the copper plate) which is preferably 5 to 100 micrometers and more preferably 10 to 50 micrometers. The thickness of the protruding portion of the active metal brazing filler metal formed as the fillet is preferably 3 to 50 micrometers and more preferably 5 to 20 micrometers. Furthermore, the rate of the copper dissolving rate to the silver dissolving rate (or the rate of the silver dissolving rate to the copper dissolving rate) of the chemical polishing solution can be calculated from the decreased amount of each of a pure copper plate (oxygen-free copper plate) and a pure silver plate having the same shape as that of the pure copper plate after the plates are dipped in the chemical polishing solution under the same conditions such as temperature and time.

It was found that a chemical polishing solution mainly dissolving copper was used in the chemical polishing, so that silver existing in the active metal containing brazing filler metal and copper plate was exposed due to the dissolution of copper to exist in the solution as insoluble silver to be adhered to the surface of the copper plate with a weak force to be formed as a layer having a thickness of about 1 micrometer to deteriorate the migration resistance of the metal/ceramic circuit board. For that reason, in the preferred embodiment of a method for producing a metal/ceramic circuit board according to the present invention, silver adhered to the surface of the copper plate is removed in order to sufficiently suppress the occurrence of migration.

The removal of silver adhered to the copper plate is preferably carried out by dipping the copper plate in a silver removing solution. This silver removing solution has a silver dissolving rate which is preferably ten times or more as high as a copper dissolving rate, and more preferably fifty times to seventy one times as high as a copper dissolving rate (the silver dissolving rate of 2.5 to 3.0 μm/min with respect to the copper dissolving rate of 0.042 to 0.050 μm/min). As such a silver removing solution, there is preferably used a chemical solution comprising acetic acid, hydrogen peroxide and the balance being water, and there can be used a silver removing solution comprising a commercially available silver plating removing agent (e.g., S-BACK AG-601 produced by Sasaki Chemical Co., Ltd.), hydrogen peroxide and the balance being water. Furthermore, the rate of the copper dissolving rate to the silver dissolving rate (or the rate of the silver dissolving rate to the copper dissolving rate) of the silver removing solution can be calculated from the decreased amount of each of a pure copper plate (oxygen-free copper plate) and a pure silver plate having the same shape as that of the pure copper plate after the plates are dipped in the silver removing solution under the same conditions such as temperature and time.

After the removal of silver, a plating film is preferably formed on the exposed surfaces of the copper plate and active metal containing brazing filler metal. The plating film is preferably a nickel plating film, and is preferably formed by electroless nickel alloy plating. In place of the formation of the plating film, rustproofing may be carried out.

Referring now to the accompanying drawings, the preferred embodiment of a method for producing a metal/ceramic circuit board according to the present invention will be described below in detail.

Figure 1B:
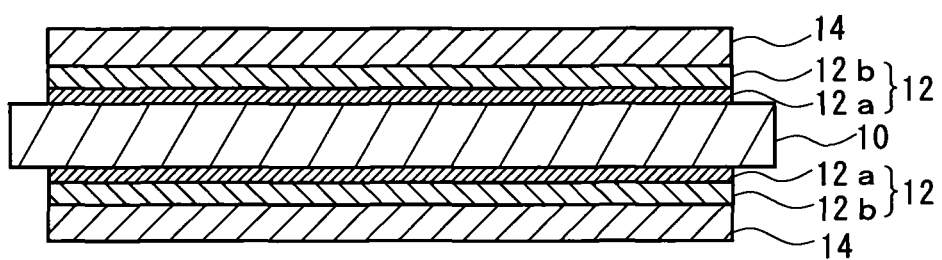
FIG. 1B is a sectional view showing a state that a metal plate is bonded to the ceramic substrate via the active metal containing brazing filler metal in the preferred embodiment of a method for producing a metal/ceramic circuit board.

As shown in FIGS. 1A and 1B, after a paste of an active metal containing brazing filler metal 12 is screen-printed on each of both sides of a ceramic substrate 10, a copper plate 14 is arranged on the active metal containing brazing filler metal 12 to be heated in a substantially vacuum or non-oxidizing atmosphere, and then, cooled to bond the copper plate 14 of each of both sides of the ceramic substrate 10. This bonding causes the active metal containing brazing filler metal 12 to be a layer (a reaction product layer) 12a, which is mainly formed of a reaction product by reacting the active metal of the active metal containing brazing filler metal 12 with the ceramic of the ceramic substrate 10, and a layer (a metal layer) 12b which is mainly formed of metals other than the active metal of the active metal containing brazing filler metal 12. The reaction product layer 12a is a layer wherein the content of metals other than the active metal is low, and the metal layer 12b is a layer wherein the content of metals other than the active metal is high. Furthermore, it can be easily confirmed by an electron probe micro analyzer (EPMA) or the like that the active metal containing brazing filler metal 12 is caused to be the reaction product layer 12a and the metal layer 12b. However, there are some cases wherein the boundary between the reaction product layer 12a and the metal layer 12b is not able to be confirmed by EPMA.

Figure 1C:
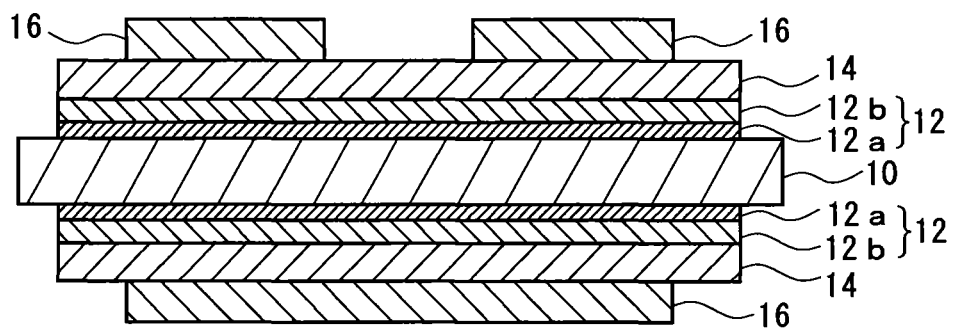
FIG. 1C is a sectional view showing a state that a resist having a desired circuit pattern is applied on the surface of the metal plate in the preferred embodiment of a method for producing a metal/ceramic circuit board.
Figure 1D:
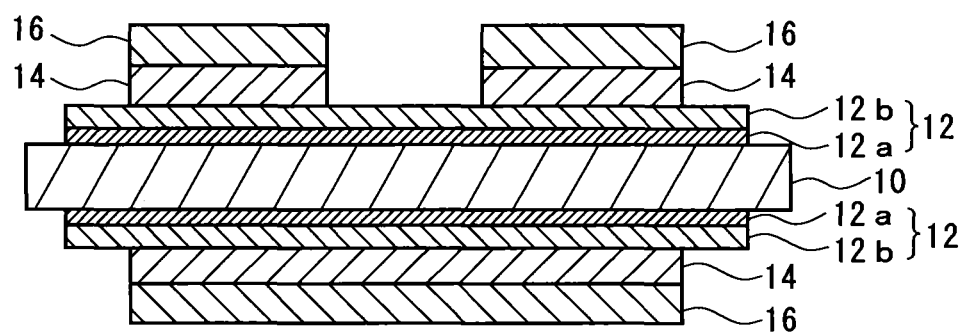
FIG. 1D is a sectional view showing a state that the unnecessary portion of the metal plate is etched to be removed in the preferred embodiment of a method for producing a metal/ceramic circuit board.
Figure 1E:
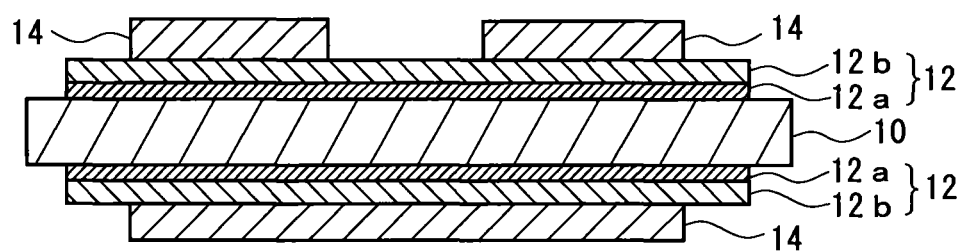
FIG. 1E is a sectional view showing a state that the resist is removed from the metal plate in the preferred embodiment of a method for producing a metal/ceramic circuit board.

Then, as shown in FIG. 1C, a resist 16 having a desired circuit pattern is applied on the surface of the copper plate 14 bonded to each of both sides of the ceramic substrate 10, and as shown in FIG. 1D, the unnecessary portion of the copper plate is etched with an etching solution of cupric chloride, an etching solution of iron chloride or the like to be removed. Then, as shown in FIG. 1E, the resist 16 is removed.

Figure 1F:
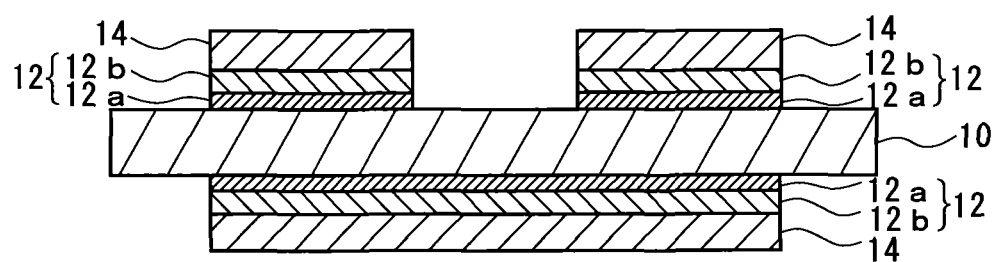
FIG. 1F is a sectional view showing a state that the unnecessary portion of the active metal containing brazing filler metal is removed in the preferred embodiment of a method for producing a metal/ceramic circuit board.

Then, as shown in FIG. 1F, the unnecessary portion of the active metal containing brazing filler metal 12 is removed with, e.g., an aqueous solution containing hydrofluoric acid, or an aqueous solution containing a compound forming a complex with the active metal, such as ethylene-diamine-tetraacetic acid (EDTA).

Figure 1G:
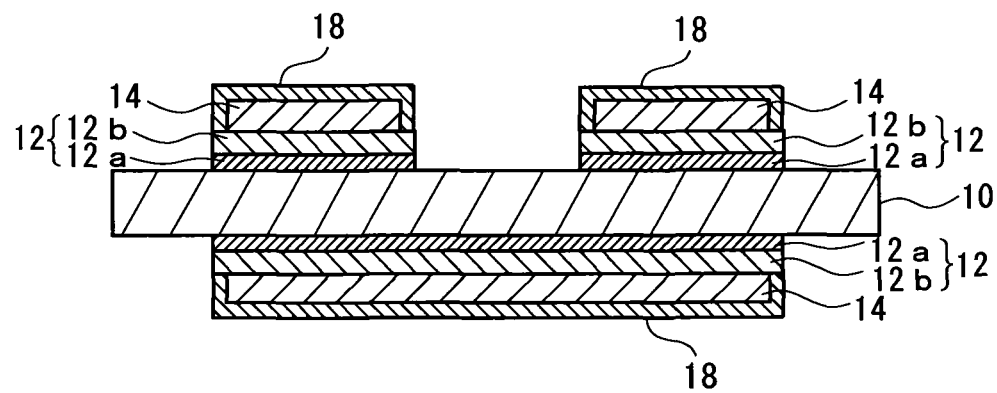
FIG. 1G is a sectional view showing a state that silver is adhered to the metal plate to form a silver layer after the surface of the metal plate is chemical-polished in the preferred embodiment of a method for producing a metal/ceramic circuit board.

Then, the surface of the copper plate 14 is chemical-polished. Then, as shown in FIG. 1G, a fillet protruding from the side faces of the copper plate 14 is formed, and silver is adhered to the surface of the copper plate 14 to form a silver layer 18.

Figure 1H:
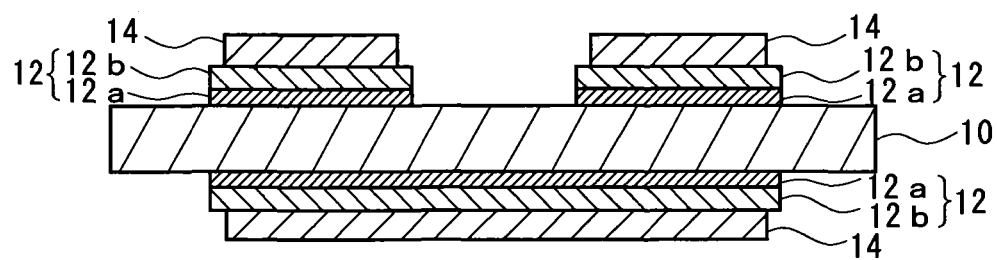
FIG. 1H is a sectional view showing a state that the silver layer is removed from the surface of the metal plate in the preferred embodiment of a method for producing a metal/ceramic circuit board.
Figure 1I:
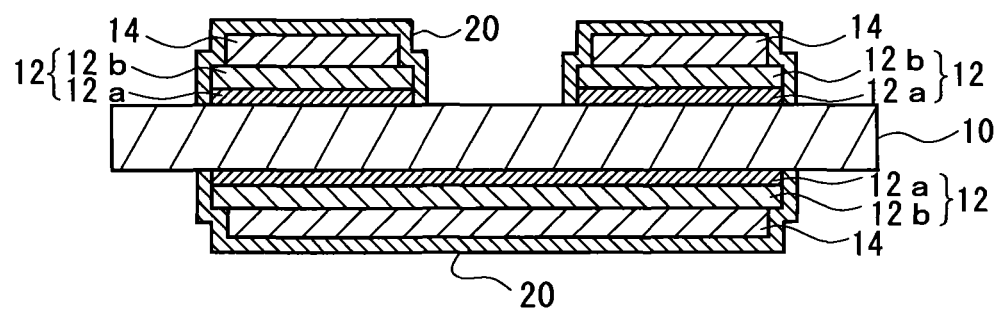
FIG. 1I is a sectional view showing a state that a plating film is formed in the preferred embodiment of a method for producing a metal/ceramic circuit board.

Then, as shown in FIG. 1H, the silver layer 18 adhered to the surface of the copper plate 14 is removed with a silver removing solution. Thereafter, as shown in FIG. 1I, a plating film 20 is formed on the copper plate 14 and active metal containing brazing filler metal 12 to obtain a metal/ceramic circuit board having a fillet (a portion of the active metal containing brazing filler metal which extends along each of both sides of the ceramic substrate 10 to protrude from the side faces of the copper plate 14) which has a predetermined width.

Examples of a method for producing a metal/ceramic circuit board according to the present invention will be described below in detail.

Example 1

An active metal containing brazing filler metal formed by adding 90% by weight of silver, 8% by weight of copper and 2% by weight of titanium (serving as an active metal component) (Ag:Cu:Ti=90:8:2) to a vehicle and kneading them was screen-printed on both sides of an aluminum nitride substrate having a size of 34 mm×34 mm×0.6 mm so as to have a thickness of 20 micrometers. Then, an oxygen-free copper plate having a size of 34 mm×34 mm×0.25 mm was arranged thereon to be heated at 850° C. in vacuum to be bonded to both sides of the aluminum nitride substrate.

Then, an ultraviolet curing, alkaline-strippable resist having a predetermined circuit pattern was applied on each of the copper plates by screen printing, and the resist was irradiated with ultraviolet rays to be cured. Thereafter, the unnecessary portion of the copper plate was etched with an etching solution comprising copper chloride, hydrochloric acid and the balance being water, and then, the resist was removed with an aqueous sodium hydroxide solution to form a copper circuit.

Then, the bonded article having the copper circuit bonded to the substrate was dipped in dilute sulfuric acid for 20 seconds to be pickled. Then, the bonded article was dipped in an aqueous chelate solution containing 1.6% by weight of EDTA.4Na, 3% by weight of aqueous ammonia (aqueous ammonia containing 28% by weight of ammonia) and 5% by weight of aqueous hydrogen peroxide (aqueous hydrogen peroxide containing 35% by weight of hydrogen peroxide) at 20° C. for 20 minutes, and then, dipped in an aqueous chelate solution containing 2% by weight of ethylene-triamine-pentaacetic acid (DTPA).5Na and 5% by weight of aqueous hydrogen peroxide at 20° C. for 52 minutes to remove the unnecessary portion of the active metal containing brazing filler metal.

Then, the copper circuit plates were dipped in a chemical polishing solution comprising 14% by weight of sulfuric acid, 3.2% by weight of hydrogen peroxide and the balance being water at 45° C. for 5 minutes to remove the unnecessary portion of the copper circuit plate by chemical polishing to cause the active metal containing brazing filler metal to protrude from the side face portions of the copper circuit plates. Thereafter, the copper circuit plates were dipped in a silver removing solution comprising 10% by weight of silver plating removing agent (S-BACK AG-601 produced by Sasaki Chemical Co., Ltd.), 50% by weight of aqueous hydrogen peroxide (containing 34% by weight of hydrogen peroxide) and the balance being water at room temperature for 3 minutes to remove silver on the surface of the copper circuit plates (silver attached thereto by chemical polishing). Furthermore, the copper dissolving rate of the used chemical polishing solution was fifty times or more as high as the silver dissolving rate thereof, and the silver dissolving rate of the silver removing solution was sixty times or more as high as the copper dissolving rate thereof.

Then, a plating film having a thickness of 3 micrometers was formed by electroless Ni—P plating so as to cover the copper plates and the active metal containing brazing filler metal to obtain a metal/ceramic circuit board.

With respect to the metal/ceramic circuit board thus produced, the following sulfur flower test was carried out to evaluate the presence of the occurrence of migration. First, after the metal/ceramic circuit board was heat-treated at 270° C. for 3 minutes, a gel (TSE3051 produced by Momentive Performance Materials Inc.) was applied on the metal/ceramic circuit board so as to have a thickness of about 1 to 2 mm, and heated at 150° C. for 1 hour to be cured. This metal/ceramic circuit board was put in a glass vessel having a volume of about 1200 $cm^3$ in which 4 g of flowers of sulfur and 20 mL of deionized water for controlling relative humidity were contained. Then, the vessel was sealed to be allowed to stand at 80° C. for 500 hours. Thereafter, a portion having a width of about 1 mm of the peripheral portion of the copper plate was observed from the top by means of an electron probe micro analyzer (EPMA) at a magnification of 500, and the portion(s) of Ag (and S) protruding from the Ni—P plating film (dot or line portion(s) having a width of not less than 5 micrometers) were confirmed by characteristic X-rays. Assuming that the protruding portion(s) were the place(s) of occurrence of migration, it was evaluated that there was no occurrence of migration when the number of the place(s) of occurrence of migration was less than 10, that there was slight occurrence of migration when the number thereof was 10 to 20, and that there was many occurrence of migration when the number thereof was 21 to 100. It was also evaluated that there was conspicuous occurrence of migration when the number of the place(s) of occurrence of migration exceeded 100, or when the places(s) of occurrence of migration had a width of 100 micrometers or more, or when the place(s) of occurrence of migration existed substantially in all of the observed area. As a result, in the metal/ceramic circuit board produced in this embodiment, the number of the place(s) of occurrence of migration was 15, so that there was slight occurrence of migration.

It was determined that breakdown was caused if a leakage current was 5 mA or more when a voltage of 2.5 kV was applied in the atmosphere between the copper circuit plate on one surface of the aluminum nitride substrate and the copper plate on the other surface thereof. As a result, breakdown was not caused, so that withstand voltage was high.

To the surface of the (plated) copper circuit plate on the one surface of the aluminum nitride substrate, a loop-shaped aluminum wire having a diameter of 0.3 mm was bonded by wire bonding. Then, it was examined whether the aluminum wire was broken without being peeled off from the surface of the copper circuit plate when the crest portion of the loop-shaped aluminum wire was pulled (i.e., the wire bonding ability of the aluminum wire to the copper circuit plate was examined). As a result, the aluminum wire was broken without being peeled off from the surface of the copper circuit plate, so that the bonding of the aluminum wire to the copper circuit plate by wire bonding was good (the wire bonding ability of the aluminum wire to the copper circuit plate was good).

In order to evaluate the solder wettability of the (plated) copper circuit on the one surface of the metal/ceramic circuit board, a solder resist was formed on portions other than a portion having a size of 10 mm×10 mm on which the solder wettability of the solder surface of the copper circuit plate was to be examined. Then, the metal/ceramic circuit board was heated at 245° C. for 2 minutes in an oven in the atmosphere, and allowed to cool. Thereafter, a solder paste (eutectic solder) was applied on a portion, on which the solder wettability was to be examined, so as to have a thickness of about 0.5 mm. Then, the metal/ceramic circuit board was heated at 200° C. for 3 minutes on a hot plate in the atmosphere, and allowed to cool. Thereafter, the proportion (the rate of wet-spread solder) of area occupied by wet molten solder with respect to the area (100 $mm^2$) of the portion, on which the solder wettability was to be examined, was measured. Furthermore, it was determined as the evaluation criteria of the solver wettability that the solver wettability was good when the rate of wet-spread solder was 95% or more and that the solver wettability was bad when the rate of wet-spread solder was less than 95%. As a result, the solder wettability of the (plated) copper circuit plate was good.

Example 2

A metal/ceramic circuit board was obtained by the same method as that in Example 1, except that an active metal containing brazing filler metal containing 83% by weight of silver, 10% by weight of copper, 5% by weight of tin and 2% by weight of titanium (serving as an active metal component) (Ag:Cu:Sn:Ti=83:10:5:2) was used in place of the active metal containing brazing filler metal used in Example 1 and that the active metal containing brazing filler metal was screen-printed so as to have a thickness of 10 micrometers.

With this metal/ceramic circuit board, the presence of occurrence of migration, the withstand voltage, the wire bonding ability and the solder wettability were evaluated by the same methods as those in Example 1. As a result, the number of the place(s) of occurrence of migration was zero, so that there was no occurrence of migration. In addition, the withstand voltage, the wire bonding ability and the solder wettability were good.

Example 3

A metal/ceramic circuit board was obtained by the same method as that in Example 1, except that an active metal containing brazing filler metal containing 83% by weight of silver, 10% by weight of copper, 5% by weight of tin and 2% by weight of titanium (serving as an active metal component) (Ag:Cu:Sn:Ti=83:10:5:2) was used in place of the active metal containing brazing filler metal used in Example 1 and that the active metal containing brazing filler metal was screen-printed so as to have a thickness of 15 micrometers.

With this metal/ceramic circuit board, the presence of occurrence of migration and the withstand voltage were evaluated by the same methods as those in Example 1. As a result, the number of the place(s) of occurrence of migration was zero, so that there was no occurrence of migration. In addition, the withstand voltage was good.

Comparative Example 1

A metal/ceramic circuit board was obtained by the same method as that in Example 1, except that the removal of silver with the silver removing solution was not carried out.

With this metal/ceramic circuit board, the presence of occurrence of migration, the withstand voltage, the wire bonding ability and the solder wettability were evaluated by the same methods as those in Example 1. As a result, the number of the place(s) of occurrence of migration was very large, so that there was conspicuous occurrence of migration, although the withstand voltage, the wire bonding ability and the solder wettability were good.

Comparative Example 2

A metal/ceramic circuit board was obtained by the same method as that in Example 2, except that the removal of silver with the silver removing solution was not carried out.

With this metal/ceramic circuit board, the presence of occurrence of migration, the withstand voltage, the wire bonding ability and the solder wettability were evaluated by the same methods as those in Example 1. As a result, the number of the place(s) of occurrence of migration was very large, so that there was conspicuous occurrence of migration, although the withstand voltage, the wire bonding ability and the solder wettability were good.

Furthermore, a cross-section of each of the metal/ceramic circuit boards in Examples 1-3 and Comparative Examples 1-2 was observed. As a result, Ag existed between the surface of the copper circuit plate and the plating film in each of the metal/ceramic circuit board in Comparative Examples 1-2, although Ag was not confirmed between the surface of the copper circuit plate and the plating film in each of the metal/ceramic circuit board in Examples 1-3.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing a metal/ceramic circuit board, the method comprising the steps of:

bonding a copper plate to at least one surface of a ceramic substrate via an active metal containing brazing filler metal which contains silver;

removing an unnecessary portion of the copper plate;

removing an unnecessary portion of the active metal containing brazing filler metal;

thereafter, removing an additional unnecessary portion of the copper plate by chemical polishing so as to cause the active metal containing brazing filler metal to protrude from a side face portion of the copper plate while causing the silver to be adhered to a surface of the copper plate to form a silver layer thereon; and removing the silver layer from the surface of the copper plate.

2. The method for producing a metal/ceramic circuit board as set forth in claim 1, wherein said active metal containing brazing filler metal comprises silver, copper and an active metal.

3. The method for producing a metal/ceramic circuit board as set forth in claim 2, wherein said active metal containing brazing filler metal further contains tin.

4. The method for producing a metal/ceramic circuit board as set forth in claim 2, wherein the content of silver in said active metal containing brazing filler metal is not less than 70% by weight.

5. The method for producing a metal/ceramic circuit board as set forth in claim 1, which further comprises a step of forming a plating film on an exposed surface of the copper plate and active metal containing brazing filler metal after removing said silver layer from the surface of the copper plate.

6. The method for producing a metal/ceramic circuit board as set forth in claim 5, wherein said plating film is formed by electroless nickel alloy plating.

7. The method for producing a metal/ceramic circuit board as set forth in claim 1, wherein said chemical polishing is carried out by a chemical polishing solution capable of dissolving copper at a rate of ten times or more higher than silver.

8. The method for producing a metal/ceramic circuit board as set forth in claim 1, wherein the removal of said silver layer is carried out by a silver removing solution capable of removing silver at a rate of ten times or more higher than copper.

* * * * *